United States Patent [19]
Gordons

[11] Patent Number: 5,568,634
[45] Date of Patent: Oct. 22, 1996

[54] METHOD OF WRITING IN A NON-VOLATILE MEMORY, NOTABLY IN A MEMORY CARD EMPLOYING MEMORY ALLOCATION STRATEGIES ON SIZE AND OCCUPANCY BASIS

[75] Inventor: Edouard M. Gordons, Aubagne, France

[73] Assignee: Gemplus Card International, Gemenos, France

[21] Appl. No.: 231,019

[22] Filed: Apr. 21, 1994

[51] Int. Cl.⁶ .................................................. G06F 12/00
[52] U.S. Cl. ........................... 395/497.01; 364/DIG. 1; 364/DIG. 2; 364/967.5; 364/281.1; 395/489; 395/430
[58] Field of Search ............................ 364/200 MS File, 364/900 MS File; 395/425, 575, 430, 442, 489, 488, 497.01, 497.02, 497.03, 600

[56] References Cited

U.S. PATENT DOCUMENTS

| | | | |
|---|---|---|---|
| 4,277,826 | 7/1981 | Collins et al. | 395/416 |
| 4,758,944 | 7/1988 | Bartley et al. | 395/497.02 |
| 4,959,774 | 9/1990 | Davis | 395/182.04 |
| 5,142,676 | 8/1992 | Fried et al. | 395/479 |
| 5,392,290 | 2/1995 | Brown et al. | 395/182.04 |
| 5,392,427 | 2/1995 | Barrett et al. | 395/600 |

FOREIGN PATENT DOCUMENTS 0400475  12/1990  European Pat. Off. .

OTHER PUBLICATIONS

P. G. Caspers et al, *Cache–Resident Processor Registers*, IBM Technical Disclosure Bulletin, vol. 22, No. 6, Nov. 1979, pp. 2317 and 2318.

*Primary Examiner*—Matthew M. Kim
*Attorney, Agent, or Firm*—Nilles & Nilles, S.C.

[57] ABSTRACT

In a system for the management of non-volatile memories, to avoid losses of information during writing, the critical writing sequences are locked. A back-up information element is stored before the performance of the critical section. The lock is constituted by the bits of the allocation table that designate the location of the saved back-up information. The lock is erased at the end of a normal writing sequence. If there is an abnormal interruption of a writing operation during the critical section, then the lock remains locked. This is detected when the power is turned on again, and the writing is resumed utilizing the saved information elements. The lock and the saved information elements are in a variable zone of the memory, thus preventing memory fatigue in the event of intensive use. Furthermore, the management of the memory is original in that two different memory allocation strategies are used to enable the detection, by the allocation table, of the presence of an information element whose location is not known.

15 Claims, 2 Drawing Sheets

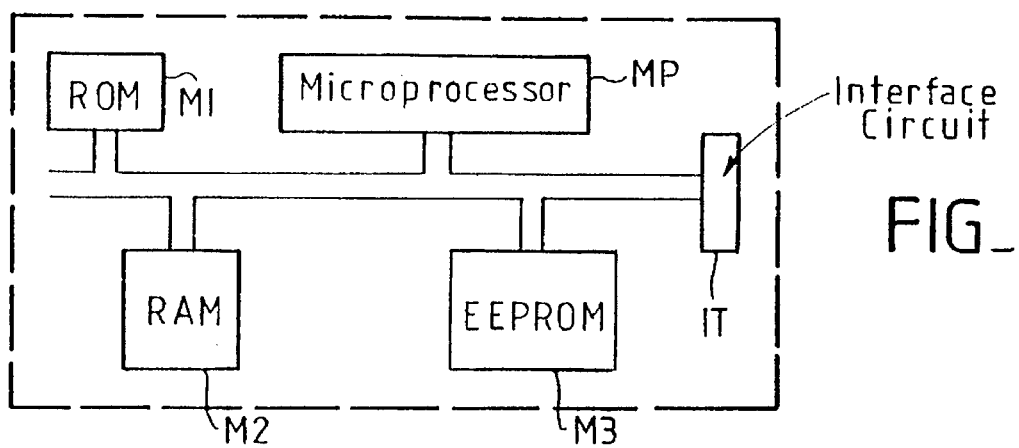
FIG_1
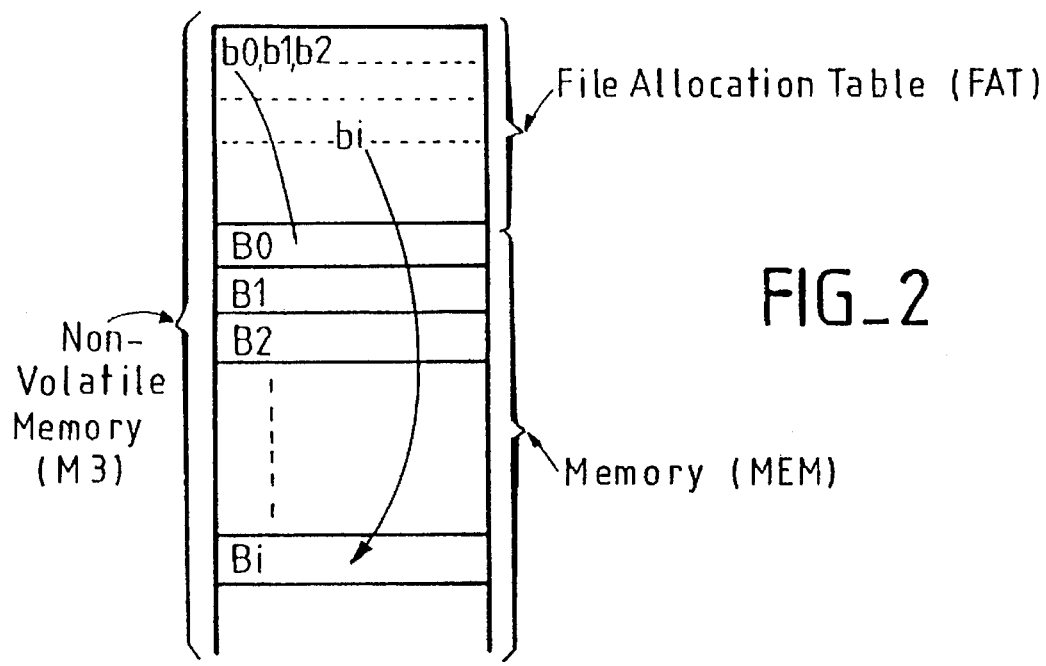
FIG_2
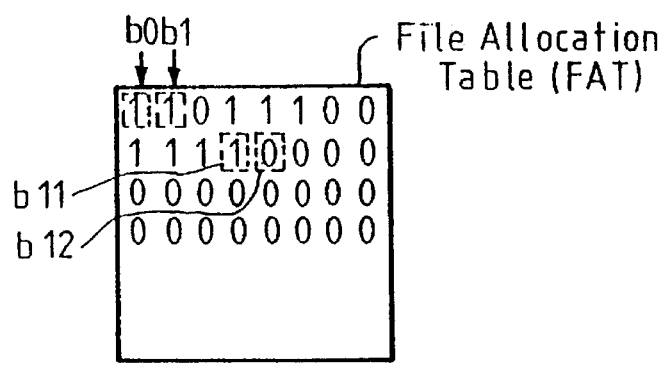
FIG_3

FIG_4

File Allocation Table (FAT)

FIG_5

File Allocation Table (FAT)

FIG_6

File Allocation Table (FAT)

METHOD OF WRITING IN A NON-VOLATILE MEMORY, NOTABLY IN A MEMORY CARD EMPLOYING MEMORY ALLOCATION STRATEGIES ON SIZE AND OCCUPANCY BASIS

BACKGROUND OF THE INVENTION

1. Field of the Invention

The invention relates chiefly to memory cards and especially to cards comprising both a non-volatile electrically programmable memory (EPROM or EEPROM) and a microprocessor to manage the information elements contained in the memory. However, the invention can be applied more generally to any system for the non-volatile storage of data elements.

The invention will be explained first of all with reference to memory cards and this will be followed by an explanation of the consequences that can be drawn therefrom more generally for other systems of memory management.

By its nature, the memory card should be capable of fulfilling its operational function under possibly harsh conditions. Certain components contain devices that enable the detection of the physical pressures and stresses to which the chip in the card is subjected. However, no means have been found until now to protect the card completely if it is pulled out of the reader during an operation for writing information elements in the card.

2. Description of the Prior Art

One way of obtaining this protection is to resume the interrupted operation when the voltage is turned on again. This implies, firstly, the ability to detect the fact that the card has been pulled out and, secondly, the ability to reconstitute the information elements that have not been written because the card was pulled out.

The systems that enable this to be done are based on a principle of protection of the critical sections of the writing sequences. The sequencing of a writing operation is controlled by the microprocessor, and certain steps of the program carried out by the microprocessor are considered to be critical steps. At each entry into a critical section, this entry is reported by positioning a "logic lock" in a determined logic state. The lock is a non-volatile memory element whose high or low state defines a locked or unlocked state. At the exit from the critical section of the program, the lock is put back into its unlocked initial state. It is the reading of this lock, which is physically fixed when the memory ceases to be supplied with power, that makes it possible, when the card is powered again, to know that the writing has been abnormally interrupted (for example because the card had been pulled out) precisely at a time when the critical section of the program was being carried out.

If it is desired to proceed in this way, then the writing of an information element INF at an address A of the memory can take place in two phases:

the information element INF and the address A are written in a zone Z of the non-volatile memory; the zone Z keeps these data elements temporarily;

the information element INF is written definitively at the address A.

The second step is considered to be a critical section: the lock is therefore placed in the "locked" state at the start of this step, and then it is unlocked at the end of the step if the entire procedure has been carried out properly.

If the procedure has been carried out properly, the contents of the zone Z are released, and the zone Z will be used again in a subsequent writing operation.

If the card has been pulled out during the critical section, then the lock is in the locked state when the card is again under power. The initialization procedure provides for an obligatory examination of the state of the lock. If it is in the locked state, the conclusion drawn therefrom is that the second step has to be carried out again. This is possible since the information INF and the address A have been kept in the non-volatile memory in the zone Z.

The frequency of use of the card can be very great. There is then a risk of intensive use of the temporary saving zone Z. The memory element that is used as a lock is also used intensively. For the EEPROM memories especially, intensive use may lead to the deterioration of the reliability of the stored information. To reduce this risk, two zones Z1 and Z2 may be used alternately. However, the lock is still constituted by the same memory element and gets used many times.

The aims of the invention are:

first of all to propose a solution for reducing the risks related to the intensive use of a temporary memory zone for memory cards in which the card operating system provides for a two-step writing operation with a critical section and a lock;

but, more generally, also to increase the possibilities of management of the non-volatile memories, whether or not it is for memory cards.

Indeed, the idea that has been developed, according to the invention, to achieve the first aim has consequences that are far more broad-ranging.

According to a first aspect, it is provided in the invention that the information saved in order to carry out a critical section will be placed at a variable position in the memory, defined by the operating system as a function of the spaces that are unoccupied or vacant when this saving is done. The location at which the saved information is stored will therefore not always be the same zone Z; it will be a random zone of the non-volatile memory.

According to a second aspect, it is provided in the invention that the lock will be placed at a variable position in the memory, defined by the operating system as a function of the spaces available when the critical section is being carried out. It will be noted that this idea is particularly unexpected: indeed, the procedure of turning the voltage on again provides for verifying the existence of a lock, which is clearly more difficult if the lock is not always at the same place and especially if its location in the memory is not known.

According to a third aspect, it is provided in the invention that the operating system of the non-volatile memory will work with a table for the allocation of available memory blocks, and with two different allocation strategies: a normal strategy and an emergency strategy for certain information elements (in the case of the saving of information elements for the performance of a critical section, it is these information elements that will be stored according to the emergency strategy), the difference between the two strategies being such that an exploration of the allocation table makes it possible to rediscover the location of an information element that has been stored according to the emergency strategy.

It can be seen that, on this third point, the invention can generally be applied to any system for the management of a non-volatile memory. Indeed, in usual operating systems (especially for the mass storage units of computers), there is generally only one strategy designed for the allocation of available blocks. This is, for example, a strategy of searching for an available space that has a sufficient size and of writing the information elements starting from the first block of this space.

The emergency strategy may consist, according to the invention, in allocating a space that begins at the second unoccupied block following an occupied block (the latter preferably being the last occupied block of the table), consequently leaving one unoccupied block between two groups of occupied blocks.

The locating of this isolated, unoccupied block will indicate that the information stored in the following blocks has been stored according to the emergency strategy. It will therefore generally give an indication of the nature of the information stored.

SUMMARY OF THE INVENTION

To summarize the main aspects of the invention, there is generally provided, first of all, a method for the storage of information elements in a non-volatile memory, wherein the physical location of the storage of the information elements in the memory is managed by an operating system enabling the allocation of the available locations as a function of the current state of filling of the memory, by means of an allocation table defining the available memory blocks and the already occupied memory blocks, wherein the operating system uses two different strategies for the allocation of space for the information elements to be stored, these strategies being respectively a normal strategy to allocate memory spaces to ordinary information elements and an emergency strategy to allocate memory spaces to certain particular information elements so as to enable the retrieval, from the allocation table, of the particular information elements even if they are stored at a location that is unknown in principle.

And for the more particular application to memory cards, the invention proposes a method for the operation of a memory card to memorize an information element (INF) in a non-volatile memory of the card, wherein the physical location of the storage of the information elements in the memory is managed by an operating system enabling the allocation of the available locations as a function of the current state of filling of the memory, the method having the following particular features:

- it comprises a two-phase operation of writing in the memory, the first phase comprising a storage, in a non-volatile memory, of a back-up information element (I) and the storage, in a non-volatile memory, of a locking information element indicating that the first phase has been carried out, and the second phase comprising the definitive writing of the information element (INF), and then the erasure of the locking information element,
- the back-up information element (I) is stored, during the first phase, at a variable location in the non-volatile memory, this location being defined by the operating system as a function of the blocks available in the memory at the time of this storage.

The locking information is preferably also stored at a variable location defined by the operating system as a function of the current occupation of the memory.

The locking information can then quite simply be constituted by the information on the availability of the memory blocks that contain the back-up information, this information on availability being placed in the allocation table prepared by the operating system.

In this case, it is quite particularly appropriate to provide for an emergency allocation strategy to memorize the back-up information (I) while a normal strategy is used to store the information (INF) to be stored finally.

BRIEF DESCRIPTION OF THE DRAWINGS

Other features and advantages of the invention shall appear from the following detailed description, made with reference to the appended drawings of which:

FIG. 1 shows the general constitution of a microprocessor-based memory card;

FIG. 2 shows a schematic view of the contents of a non-volatile memory, managed by means of a file-allocation table;

FIG. 3 shows a simplified example of the contents of the allocation table;

FIG. 4 gives a view, for this same example, of the that are, modified during the bits temporary saving of a critical information element;

FIG. 5 shows the writing of definitive information during a locked critical section;

FIG. 6 shows the unlocking after the successful performance of the critical writing section.

MORE DETAILED DESCRIPTION

The following detailed description shall be made solely with reference to a memory card and shall relate to the case of the writing of an information element in two phases width the saving of information before the performance of a critical section of a program for writing in the memory. This description shall be made first of all in assuming that the information I to be saved temporarily in the memory is precisely the information element INF to be written definitively in the memory. This represents only a particular example of the invention. It is the example that is easiest to describe, and that is why it serves as the basis of the following description.

However, it must be understood that it is possible to encounter situations of greater complexity, wherein the information element I, written during a critical section, is an information element related to the information element INF to be recorded but is not directly this information element to be recorded.

The most characteristic example of this situation of greater complexity is the case where the information elements to be memorized are "chained" files. A "chained" file for which each recording contains the address of the next recording. In this case, the critical section to be locked is not necessarily the information writing phase, but may rather be the phase in which all the chains of the file are updated. The preliminary saving phase will then relate to the information elements on the updating of the chains.

A description shall therefore be given, first of all, of the simplest case in which an information element INF is to be written in the memory card, the temporarily saved information element I being essentially the information element INF.

A summary view of the electronic circuit of a microprocessor-based memory card is shown in FIG. 1. The circuit has a microprocessor MP to which there are connected an interface circuit IT for communication with the exterior, a read-only memory (ROM) M1, a working random-access memory (RAM) M2 and a non-volatile memory (EPROM or EEPROM) M3.

The program memory contains notably the operating system of the card, which manages the internal and external communications protocols of the card and manages the content of the non-volatile memory M3.

The operating system of the memory card uses a non-volatile memory to assign well-determined physical locations to any new piece of information written in the memory M3 of the card. This non-volatile memory is preferably quite simply a portion of the non-volatile memory M3. In general, the first blocks of the memory M3 may be used for this purpose, and they constitute a File-Allocation Table FAT (or Eprom-Allocation Table EAT) used solely for the management of the data files stored in the memory M3.

FIG. 2 therefore gives a schematic view of the constitution of the content of the memory M3 with a FAT zone reserved for the management of the memory. The rest of the memory is a portion MEM in which any information elements may be stored.

The memory MEM (or more generally M3) is divided into successive information blocks. Each block may comprise several memory words. The words may be eight-bit bytes. Each of the blocks represents a physical memory location. The blocks are preferably all of the same length. For example, they all have a length of eight bytes.

Each block is represented by an image in the allocation table. This image is a bit or a word representing a determined block. The position of a word in the allocation table therefore provides a one-to-one definition of the physical position of a block of the memory MEM.

The content of a word in the allocation table may represent several information elements including, above all, the availability or unavailability of the corresponding memory block. Hereinafter, it shall be assumed that only one memory bit is enough to represent this availability and, hence, that the allocation table is constituted by a succession of bits, the position of a bit in the table providing a one-to-one representation of the designation of a memory block in the memory MEM, and the state of the bit representing the availability (with the bit at 0 for example) or unavailability((with the bit at 1) of the designated block.

The system described here above is based simply on the disk operating systems used for the management of magnetic disks in computers.

In FIG. 2, the bits of the allocation table FAT are designated by b0, b1, b2, etc., and the corresponding blocks of the memory MEM are designated by B0, B1, B2, etc.

FIG. 3 shows a very simplified example of the contents of the allocation table FAT (or EAT) with its correspondence in the memory MEM: certain blocks are available while others are occupied. The allocation table is filled as a function of this availability.

In the example shown, the table has, first of all, unavailable blocks (B0, B1), then perhaps one or more unoccupied blocks (B2), again occupied blocks (B3, B4, B5), unoccupied blocks (B6, B7), occupied blocks (B8, B9, B10, B11) and so on, until the only blocks encountered up to the end of the table are a succession of unoccupied blocks (in this case: B12 and all the following blocks). Here B11 is the last occupied block of the table.

For the normal management (without temporary saving and without protection by a critical section lock) of the contents of the memory MEM, a writing step consists in requesting the operating system of the memory to allocate a memory location that is sufficient to write the desired information INF, for example P blocks. The allocation system therefore makes a search, in the table, for a unoccupied space of P consecutive blocks enabling the information INF to be written. The strategy of searching for and allocating space is always the same. The strategies best known in the management of magnetic disks include notably the following:

the so-called "first fit" strategy: the system makes a search in the allocation table, by travelling through it from the beginning, for the first unoccupied space comprising at least P consecutive unoccupied blocks, and it allocates these spaces, starting with the first block of the unoccupied space found;

the "last fit" strategy: searching for the last unoccupied space having sufficient length, and allocating blocks starting from the first block of the space found;

the "best fit" strategy: searching for the smallest of the unoccupied spaces with a length of at least P blocks, among all the unoccupied spaces, with a length greater than P blocks, that are found in the table; and the allocation of blocks starting from the first unoccupied block of the selected space.

In the strategy given here, it is assumed, for example, that the strategy used is the first one (the "first fit" strategy). In the example of FIG. 3, the conventional (unprotected) writing of an information element of at least two blocks would be done in the blocks B6 and B7 while the writing of an information element with a length of three blocks or more would be done from the block B12.

According to the invention, the allocation system will be used to find a space for the storage of an information element I which is temporarily saved during the performance of a critical section of the writing operation, so that this information element will not always be stored at the same place.

Furthermore, the information used as the locking information will be the bits of the allocation table that designate the location of this saved information, so that the locking information will not always be stored in the same memory cell or cells.

Finally, the invention will use the original principle that consists in using two allocation strategies that differ according to the information element stored: a normal strategy to allocate a space for storing the usual information elements such as INF and an emergency strategy to allocate a space for the storing the saved information element I.

It is the use of two different allocation strategies that will then very simply make it possible, by the simple exploration of the allocation table when the memory card is powered again, to know whether a back-up information element has been kept in the memory. The detection of an information element such as this is then the sign that the writing operation in the critical section has taken place abnormally and that the saved information elements have to be taken up in order to be written again.

Consequently, while the operating system does not know the location of the lock that it must verify when the power is turned on again, the exploration of the configuration of the table will enable it to find both the lock and the saved information element since:

1. The configuration of the table will reveal the fact that an information element has been stored by means of the emergency allocation strategy.

2. The configuration will reveal those bits of the allocation table that are concerned and that constitute the critical section lock;

3. And, finally, the position of these locking bits will designate the position (which is unknown in principle) of the saved information.

Preferably, the emergency strategy will be as follows: a search is made for the last occupied block in the table (B11 in the example of FIG. 3); a space starting with the second unoccupied block (B13) after this last occupied block is allocated to the information element I to be saved. Only one unoccupied block (B12) remains unused.

The two-phase writing procedure can be carried out as follows:

first phase: the writing of the back-up information I according to the emergency strategy: the writing is done starting from the block B13 (which is the second unoccupied block after the last occupied block in the table) and ends at block B14; the information element I may be the information element INF to be stored, possibly with other information elements such as a specific code indicating that it is truly a back-up information element and not a definitive information element; this code is used to remove any ambiguity over the detection of a lock when the card is powered again as shall be seen hereinafter; the bits b13 and b14 of the table are put, at the same time, in the state 1 and thereupon constitute the critical section lock (see FIG. 4);

second phase, which is phase of the critical section protected by a lock: the definitive writing of the information element INF according to a standard strategy of allocation; if the information element uses only two blocks, it can be written in the blocks B6 and B7. If it uses more of them, it is written starting with the block B15.

FIG. 5 Shows the allocation table FAT in this phase. In the example of FIG. 5, the information element uses five blocks, and is therefore written in blocks B15-19. The blocks B13-B14 are still allocated by bits b13-14 of the FAT to the back-up information element.

If everything happens as it should, the final step of the writing consists in erasing the lock, thus marking the end of the critical section.

This erasure consists simply in releasing the blocks B13 and B14 that contain the saved information, in resetting the corresponding bits b13 and b14 of the allocation table at 0.

FIG. 6 shows the FAT at this phase. The bits b13-b14 are at 0, indicating that the blocks B13-B14 are unoccupied. The bits b15-b19 are at 1, indicating that the blocks B15-B19 are occupied (i.e., by the definitive information element). The bits b20 and beyond are at 0, indicating that the blocks B20 and beyond are unoccupied. The memory is ready for other operations.

If the writing operation has been interrupted abnormally during the critical section, then the configuration at the time of the interruption is that of FIG. 4 or of FIG. 5 with the lock in position.

The configuration of the allocation table is then a special configuration in that the last bit at 0 (b12) which precedes the last group of bits at 1 (b13, b14 in FIG. 4 or b13 to b19 in FIG. 5) is a single bit at 0 between two groups of bits at 1. In other words, there is an unoccupied block B12 isolated between occupied blocks, and this unoccupied block is the last unoccupied block in the actually used part of the memory.

The procedure used to power the card again will obligatorily comprise a procedure for the detection of such a configuration. This configuration results, in principle, from the fact that certain information elements have been written with an emergency strategy that is different from the normal strategy for the writing of the other information elements. This detection procedure will comprise a search for the last group of bits at 1 in the allocation table and a search for the last bit at 0 preceding this group of bits at 1. If this bit at 0 is sandwiched by bits at 1, then there is a high probability that it signifies the presence of a lock.

To make this search, the allocation table will be crossed in the direction opposite to the normal direction, i.e. by making a trace-back from the end of the table until the first group of bits at 1 and then the first bit at 0 are encountered, and finally by examining the following characteristic bit during this trace-back operation:

if this bit is at 0, then there is no lock in position. This is the case in FIG. 6: the bits b14, the first bit at 0, starting from the end, is not sandwiched by two bits at 1;

if, on the contrary, it is at 1, then very probably there is a lock in position. This is the case in the configuration of FIG. 5 or 4: the bit b12, the first bit at 0 starting from the end, is sandwiched by two bits at 1.

In the last-named case, the procedure for starting the operation Of the card, carried out by the operating system, comprises the resumption of the second writing step; this resumption is protected by the critical section lock (b13, b14) which has not changed its state. The allocation system (according to the normal allocation strategy) allocates available blocks for the information element INF. And the information element INF, gathered in the locations designated by the lock, is written in these locations. After this, the lock is erased.

There may be ambiguity as regards the memory configuration which indicates the presence of a lock. For it may happen that, in certain cases, the normal writing strategy ("first fit", "last fit", "best fit" or other) leads; to a configuration with an isolated unoccupied block between two occupied blocks, this unoccupied block being the last unoccupied block before the end of the occupied zone of the allocation table. In this case, the configuration suggests that a lock has been positioned by means of the emergency strategy whereas this is not the case.

To remove any ambiguity in this case of emergency, it is provided that the blocks allocated for the back-up information I store not only the information to be saved but also a code indicating that the information is really a back-up information element. If this code is not found at the reading of the blocks designated by the lock, the writing is not resumed.

To avoid an excessive fragmentation of the memory M3, i.e. to avoid having too many unoccupied blocks sandwiched by occupied blocks, the operating system may first of all reserve the definitive space needed for the information element INF. In this case, returning to the illustration of FIG. 5, there will be b12 to b15 allocated to the definitive information element "1111".

Then, when the back-up space I is allocated, there will be:

b12 to b15=1 1 1 1 (INF)

b16 to b19=+b 0 1 1 1 1 (I)

Thus the releasing of the space allocated for the back-up information I will not give rise to any "gaps" once the writing is ended:

b8 to b15=1 1 1 1 1 1 1 1

B16 to b23=0 0 0 0 0 0 0 0

The invention is also applicable when the saved information I is not the information INF to be written definitively in the memory.

A simple example thereof may be given with reference to the case where the memory contains files formed by a sequence of chained recording. The i order recording of the file contains the address of the i+1 order recording, thus making it possible to go through the chain in one direction. If the file is to be capable of being crossed in both directions, the i order recording should also contain the i−1 order recording.

A new recording can be added in the file as follows:

the first phase: a request is made to the operating system for a memory space that is sufficient for the writing of the recording; the corresponding bits are positioned in the allocation table according to a normal strategy of allocation; then the information elements are written at the allocated location (this recording, although definitive, is not a critical section of the writing sequence, contrary to the case described here above); then a request is made for an unoccupied space for an information element to be saved for a critical section (the information element to be saved is the information element needed to update the chains); finally the bits of the allocation table that designate the location of the saved information elements and that will serve as a lock are set at 1;

the second phase, which is that of the critical section that has to be carried out again if the card should be pulled out during this phase, is the phase for the definitive updating of the chaining.

The locking bits are then reset at 0 if the operation has been carried out without any hitch.

In this case, to distinguish a lock from an ordinary information element, when the configuration of the allocation table accidentally represents a configuration with a lock, the invention uses the fact that the recordings all have a following or preceding recording address. The blocks containing the saved information elements could contain an impossible address (an address outside the memory M3) instead of a following recording address. This makes it possible to ascertain that the blocks designated by the locking bits are truly "back-up" blocks.

A redundancy code using the length of the "back-up" recording may also be placed at the end of the recording to ensure that the information elements have not been lost during the writing, in the non-volatile memory, of the "back-up" information elements.

A description has thus been given of a case wherein the saved information I is not exactly the information INF to be memorized definitively.

Naturally, the emergency strategy may be different. The allocation of the space may begin at the third, fourth, fifth unoccupied block after the last occupied block.

What is claimed is:

1. A method of storing information elements in a non-volatile memory of a chip card, the non-volatile memory comprising memory blocks including a plurality of occupied memory blocks and a plurality of unoccupied memory blocks, the method comprising the steps of:

ascertaining which memory blocks are occupied and which memory blocks are unoccupied, the ascertaining step further comprising the step of accessing a file allocation table;

allocating the unoccupied memory blocks based on the ascertaining step, the memory blocks being allocated for the storage of the information elements, the allocating step further comprising the steps of ascertaining whether the information elements are locking information elements, and if the information elements are locking information elements, then allocating the information elements according to an emergency allocation strategy, and if the information elements are not locking information elements, then allocating the information elements according to a normal allocation strategy.

2. The method according to claim 1, further comprising the step of locating a second unoccupied block, the second unoccupied block following a first unoccupied block, the first unoccupied block following an occupied block, and wherein the emergency allocation strategy comprises allocating a space starting at the second unoccupied block.

3. The method according to claim 2, wherein the occupied block is a last occupied block of the table.

4. The method according to claim 1, wherein the normal allocation strategy comprises allocating a space which starts at a first unoccupied block following an occupied block and which forms part of an unoccupied space which is large enough to store the information elements.

5. A method of storing information elements in a non-volatile memory of a chip card, the non-volatile memory comprising memory blocks including a plurality of occupied memory blocks and a plurality of unoccupied memory blocks, the method comprising:

a first storing step, the first storing step including the steps of ascertaining which memory blocks are occupied and which memory blocks are unoccupied, the ascertaining step further comprising the step of accessing a file allocation table, backing up the information elements in the non-volatile memory, the backing up occurring at a first location which is determined based on the ascertaining step, and storing a locking information element in the non-volatile memory, the storage of the locking information element indicating that the first storing step has been completed, and the locking information element being stored at a second location which is determined based on the ascertaining step; and a second storing step, the second storing step including the steps of storing the information elements in the non-volatile memory, and erasing the locking information element stored at the second location of the non-volatile memory;

wherein the locking information element comprises bits of the file allocation table that designate the first location.

6. The method according to claim 5, wherein the step of storing the information elements further comprises the step of using a normal allocation strategy, and wherein the step of backing up the information elements further comprises the step of using an emergency allocation strategy, the use of the emergency allocation strategy creating a configuration of the file allocation table which permits detection of the locking information element in the file allocation table.

7. The method according to claim 6, further comprising the step of locating a second unoccupied block, the second unoccupied block following a first unoccupied block, the first unoccupied block following an occupied block, and wherein the emergency allocation strategy comprises allocating a space that starts at the second unoccupied block.

8. The method according to claim 7, wherein the occupied block is a last occupied block of the table.

9. The method according to claim 7, wherein the normal allocation strategy comprises allocating a space which starts at a first unoccupied block following an occupied block and which forms part of an unoccupied space which is large enough to store the information elements.

10. The method according to claim 7, further comprising the steps of:

powering up the memory card, then searching the file allocation table for a last group of bits designating occupied blocks, then searching for a first bit designating an unoccupied block preceding the last group of bits designating occupied blocks, and then ascertaining whether a second bit preceding the first bit designating an unoccupied block designates an occupied block, and, if the second bit designates an occupied block, then resuming a writing operation of the information elements to non-volatile memory.

11. A method of storing information elements in a non-volatile memory of a chip card, the non-volatile memory comprising memory blocks including a plurality of occupied memory blocks and a plurality of unoccupied memory blocks, the method comprising:

a first storing step, the first storing step including the steps of ascertaining which memory blocks are occupied and which memory blocks are unoccupied, backing up the information elements in the non-volatile memory, the backing up occurring at a first location which is determined based on the ascertaining step, and storing a locking information element in the non-volatile memory, the storage of the locking information element indicating that the first storing step has been completed, and the locking information element being stored at a second location which is determined based on the ascertaining step; and a second storing step, the second storing step including the steps of storing the information elements in the non-volatile memory, and erasing the locking information element stored at the second location of the non-volatile memory.

12. The method according to claim 11, wherein the step of storing the information elements further comprises the step of using a normal allocation strategy, and wherein the step of backing up further comprises the step of using an emergency allocation strategy, the use of the emergency allocation strategy creating a configuration of the file allocation table which permits detection of the locking information element in the file allocation table.

13. The method according to claim 12, further comprising the step of locating a second unoccupied block, the second unoccupied block following a first unoccupied block, the first unoccupied block following an occupied block, and wherein the emergency allocation strategy comprises allocating a space that starts at the second unoccupied block.

14. The method according to claim 13, wherein the occupied block is a last occupied block of the table.

15. The method according to claim 13, wherein the normal allocation strategy comprises allocating a space which starts at a first unoccupied block following an occupied block and which forms part of an unoccupied space which is large enough to store the information elements.

* * * * *